United States Patent
Yang et al.

(10) Patent No.: US 6,495,417 B1
(45) Date of Patent: Dec. 17, 2002

(54) METHOD FOR INCREASING TOLERANCE OF CONTACT EXTENSION ALIGNMENT IN COB DRAM

(75) Inventors: Yu-Ju Yang, Hsin-Chu (TW); Yi-Min Jen, Pan-Chiao (TW); Kuo-Yuh Yang, Chu-Pei (TW); Yu-Hong Huang, Tainan (TW)

(73) Assignee: United Microelectronics Corps. (TW)

( * ) Notice: Subject to any disclaimer, the term of this patent is extended or adjusted under 35 U.S.C. 154(b) by 92 days.

(21) Appl. No.: 09/669,940

(22) Filed: Sep. 26, 2000

(51) Int. Cl.[7] .......................................... H01L 21/8242
(52) U.S. Cl. ..................... 438/253; 438/239; 438/250; 438/254; 438/396; 438/393; 438/397
(58) Field of Search ................................. 438/396, 253, 438/239, 250, 254, 393, 397

(56) References Cited

U.S. PATENT DOCUMENTS

| | | | |
|---|---|---|---|
| 4,714,686 A | * 12/1987 | Sander et al. | 438/631 |
| 5,338,750 A | * 8/1994 | Tuan et al. | 438/448 |
| 6,143,602 A | * 11/2000 | Jang | 438/253 |
| 6,277,688 B1 | * 8/2001 | Tseng | 438/255 |
| 6,325,676 B1 | * 12/2001 | Jung et al. | 216/67 |
| 6,358,827 B1 | * 3/2002 | Chen et al. | 438/264 |

OTHER PUBLICATIONS

Wolf et al. Silicon Processing for the VLSI Era, vol. 1, Process Technology 1986, Lattice Press, pp. 177, 191–192, 529–532.*

* cited by examiner

Primary Examiner—John F. Niebling
Assistant Examiner—Jennifer M. Kennedy
(74) Attorney, Agent, or Firm—Powell Goldstein Frazer & Murphy LLP

(57) ABSTRACT

A method for increasing tolerance of contact extension alignment in a capacitor over a bit line of a dynamic random access memory is disclosed. Firstly, a substrate having a gate, a bit line and a source/drain region is provided and an insulating layer is formed on the substrate. Then, a dielectric layer is deposited on the insulating layer. Moreover, a contact hole is formed by defining and etching the dielectric layer and the insulating layer to expose a portion of the source/drain region. Furthermore, a conductive layer is deposited on the dielectric layer and the contact hole, wherein the etching selectivity ratio of the conductive layer is near the etching selectivity ratio of the dielectric layer. Finally, an electrode of the capacitor is formed by defining and etching the conductive layer, whereby the dielectric layer protects the portion of the electrode that is beneath the dielectric layer from being etched when misalignment occurs.

21 Claims, 4 Drawing Sheets

METHOD FOR INCREASING TOLERANCE OF CONTACT EXTENSION ALIGNMENT IN COB DRAM

BACKGROUND OF THE INVENTION

1. Field of the Invention

The present invention relates to a method for increasing tolerance of contact extension alignment in a dynamic random access memory (DRAM), and more particularly to a method for increasing tolerance of contact extension alignment in a capacitor over a bit line (COB) of a dynamic random access memory.

2. Description of the Related Art

Dynamic random access memory is applied broadly in the field of integrated circuits devices, and more importantly, in the electronics industry. Dynamic random access memories with higher capacitance are necessary for the development of the industry. As a result, dynamic random access memories with higher density and capacitance are of great interest and are developed by the related industry. How to keep the quality as the size of the device is reduced is now a task for the industry to overcome.

For the storage of digital data, the capacitance of the memory is called a "bit" and the unit for data storage in a memory is called a "memory cell". The memory cell is arranged in array, consisting of columns and rows. A set of a column and a row represents a specific address. Memory cells in the same column or the same row are coupled by a common wiring line, which is called a word line. The vertical wiring line, which is used to data transmitting is called a bit line. The current design of DRAM is composed of a transistor, which is series-coupled to a capacitor to replace the original memory consisting of three transistors. In this manner, the circuit is simplified and the density of the device can be increased.

For the design of Ultra Large Scale Integration (ULSI) dynamic random access memory, the lithography and alignment controlling the contact is more and more critical as the device size reduces gradually. Misalignment can severely impact the functionality of a device. It may cause circuit failures of a dynamic random access memory. To insure that contacts between interconnect layers are made properly even if a slight misalignment occurs during masking steps, extra space is usually included in a design around contacts and other conductive features. However, the problem of Misalignment beyond certain minimum tolerance due to shrinking of the design rule still cannot be resolved completely.

FIG. 1 is a schematic cross sectional diagram of a conventional capacitor over a bit line of a dynamic random access memory. Firstly, a substrate 100 having a field oxide region 102, source/drain regions 106a, 106b is provided. Then, a polysilicon layer used as a gate electrode 104a and a word line 104b is formed. Next, an oxide layer 112 is formed to cover the gate electrode 104a and the word line 104b. polysilicon layer is formed then defined as bit lines 114a and 114b. Moreover, two planarized insulating layers 116a, 116b are provided on the bit lines 114a, 114b and a contact hole is formed by patterning to etch the planarized insulating layers 116a, 116b and the oxide layer 112 to expose a portion of the source/drain regions 106a, 106b. The contact hole is filled with a polysilicon layer 118 to serve as a first electrode of the capacitor. The first electrode of the capacitor is formed by patterning to etch the polysilicon layer 118 wherein the pattern, which defines the first electrode of the capacitor, is formed with a result of misalignment. The misalignment may be formed due to errors of the lithography process. Because of the misalignment, a trench 122 is formed after the sequential etching process. A dielectric layer 120 is deposited on the polysilicon layer 118, the planarized insulating layer 116b and the trench 122. The trench 122 is covered with poor step coverage. Finally, a polysilicon layer 124 is formed on the dielectric layer 120 to serve as a second electrode of the capacitor.

As shown in FIG. 1, the device may not be reliable, because the trench 122 may cause the failure of the circuit when the device size reduces and the isolation between the gate electrode 104a, the bit line 114a and the first electrode of the capacitor 118 degrades. The trench 112 may also cause a failure of the capacitor due to the poor step coverage of the dielectric layer 120 in the trench 122.

SUMMARY OF THE INVENTION

It is therefore an object of the invention to increase tolerance of contact extension alignment in a capacitor over a bit line of a dynamic random access memory that substantially prevents the failure of the electrode of the capacitor from being formed. Furthermore, circuit failures of a capacitor over a bit line of a dynamic random access memory due to misalignment can be avoided.

It is another object of this invention that the alignment limitation of the contact extension can be reduced in spite of the shrinking of the design rule.

It is a further object of this invention that the difficulty of the etching process can be reduced as the device size decreases in order to obey the design rule.

To achieve these objects, and in accordance with the purpose of the invention, a method for increasing tolerance of contact extension alignment in a capacitor over a bit line of a dynamic random access memory is disclosed. Firstly, a substrate having a gate, a bit line and a source/drain region is provided and an insulating layer is formed on the substrate. Then, a dielectric layer is deposited on the insulating layer. Moreover, a contact hole is formed by defining and etching the dielectric layer and the insulating layer to expose a portion of the source/drain region. Furthermore, a conductive layer is deposited on the dielectric layer and the contact hole, wherein the etching selectivity ratio of the conductive layer is near the etching selectivity ratio of the dielectric layer. Finally, an electrode of the capacitor is formed by defining and etching the conductive layer, whereby the dielectric layer protects the portion of the electrode that is beneath the dielectric layer from being etched when misalignment occurs.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
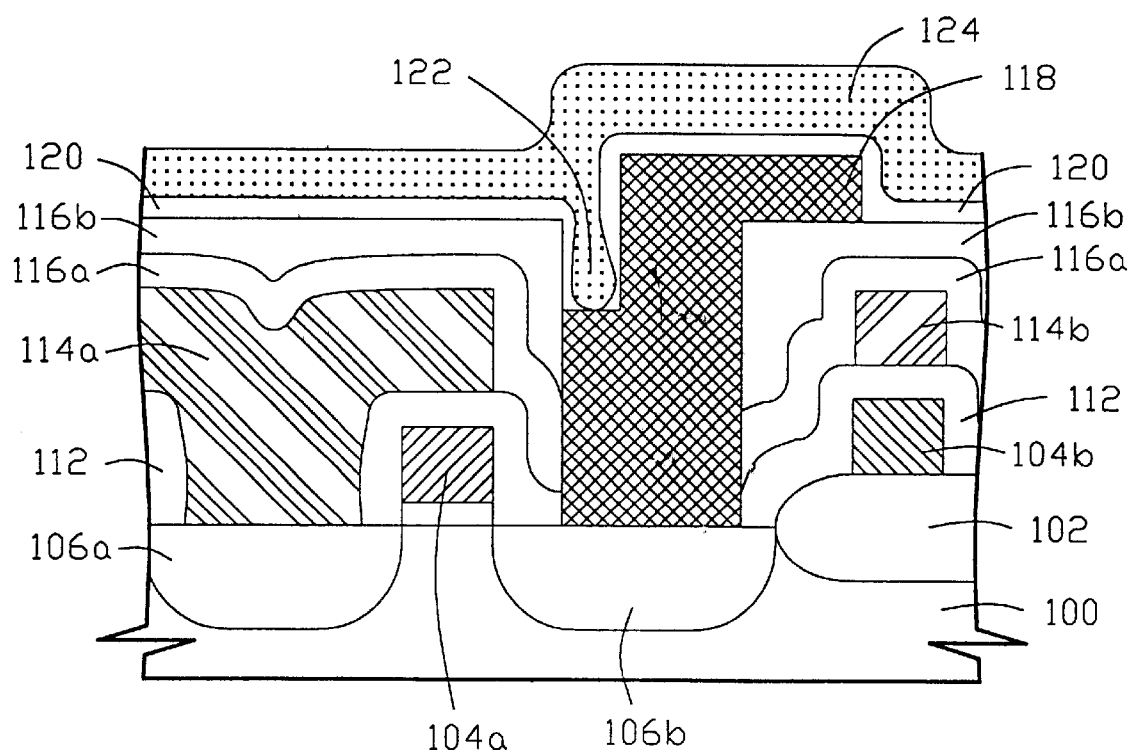
FIG. 1 is a schematic cross sectional diagram of a conventional capacitor over a bit line of a dynamic random access memory wherein the electrode of the capacitor is formed with a result of misalignment.

The invention uses a dielectric layer, which is formed interposed between the planarized insulating layer and the conductive layer used as an electrode of the capacitor to increase tolerance of contact extension alignment in a capacitor over a bit line of a dynamic random access memory. The etching selectivity ratio of the dielectric layer is near the etching selectivity ratio of the conductive layer. When misalignment occurs, the dielectric layer can serve as a buffer layer in etching process, and the trench 122 shown in FIG. 1 can be avoided.

Figure 2:
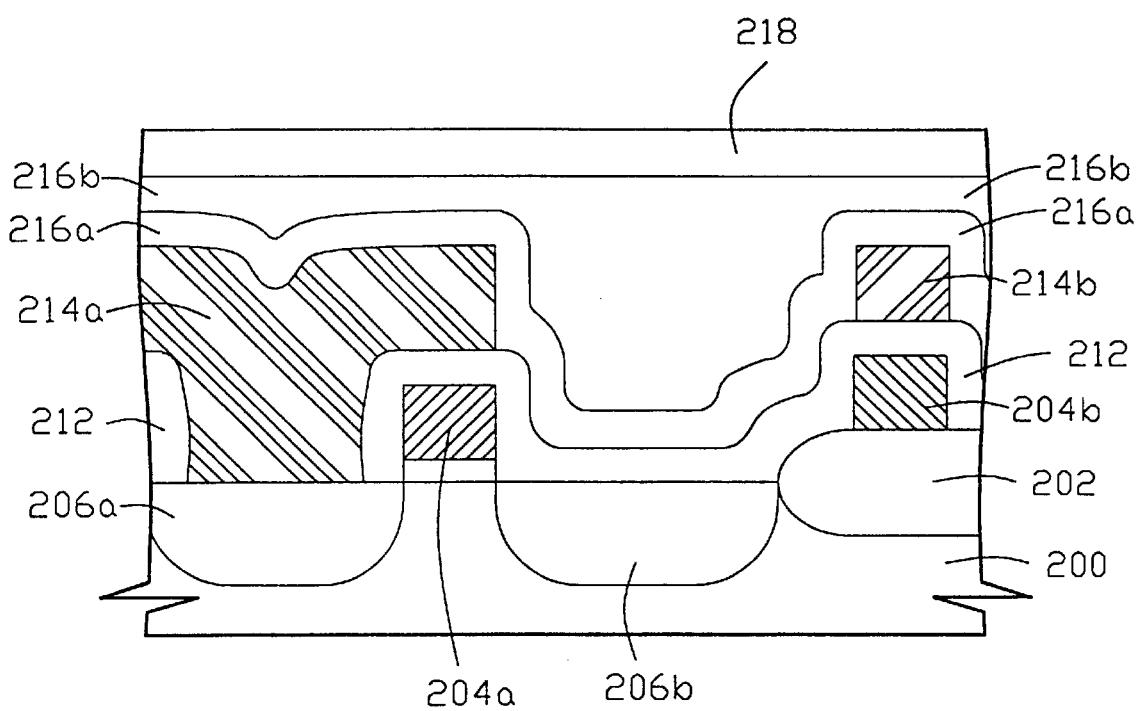
FIG. 2 shows a result of depositing a dielectric layer on an integrated circuit.

Referring to FIG. 2, a schematic cross sectional diagram of an integrated circuit is shown. Firstly, a silicon substrate 200, having source/drain regions 206a, 206b and a field oxide region 202, and preferably with a <100>crystallographic orientation, is provided. The source/drain region 206a, 206b and the field oxide region 202 can be formed by conventional processes and materials. Secondly, a conductive layer, used as a gate electrode 204a, a word line 204b is deposited on the substrate 200 by using a conventional chemical vapor deposition process. The gate electrode 204a, the word line 204b can be formed by using conventional lithography and etching processes. Thirdly, an oxide layer 212 is deposited on the gate electrode 204a and the word line 204b by using a conventional chemical vapor deposition process. Then, a conductive layer, used as bit lines 214a, 214b, is deposited on the oxide layer 212 by using a conventional chemical vapor deposition process. The bit lines 214a, 214b can be formed by using conventional lithography and etching processes. Next, two planarized insulating layers 216a, 216b are deposited on two bit lines 214a, 214b by using a conventional chemical vapor deposition process.

The planarized insulating layers 216a, 216b are planarized by a chemical mechanical polish process. Finally, a dielectric layer 218 is depositing on the planarized insulating layers 216b by using a conventional chemical vapor deposition process, and preferably a plasma enhanced chemical vapor deposition process. Furthermore, the dielectric layer 218 is preferably a silicon nitride layer.

Figure 3:
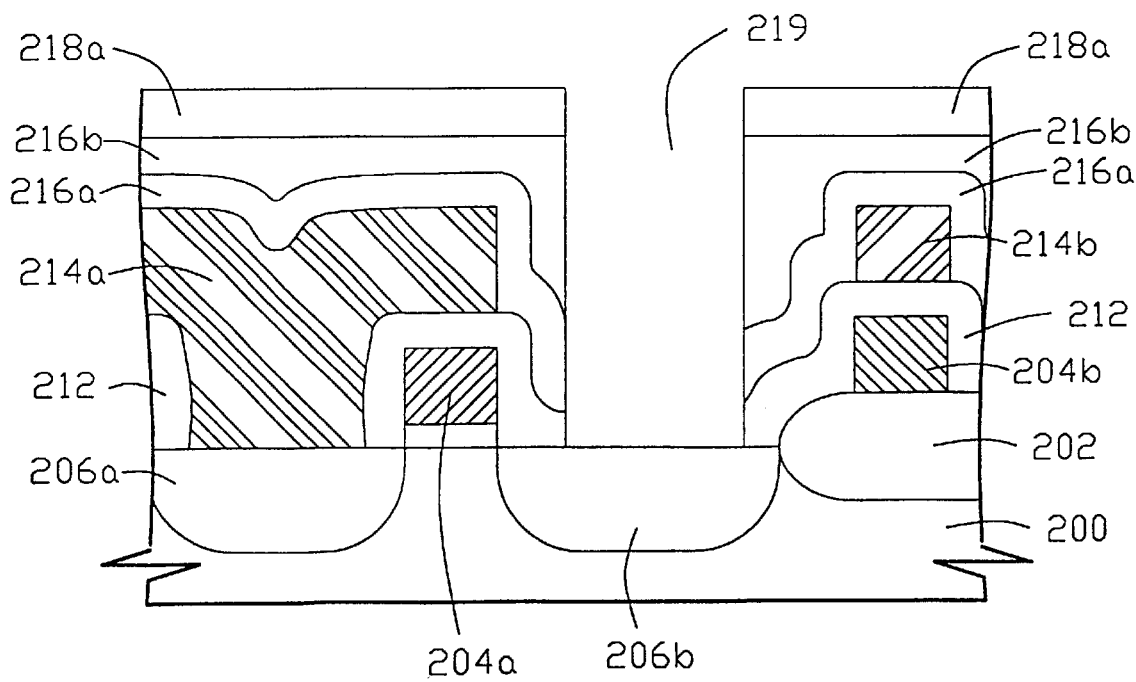
FIG. 3 shows a result of patterning to etch the dielectric layer, the integrated circuit to form a contact hole.

Referring to FIG. 3, a contact hole 219 is formed by etching the dielectric layer 218, the planarized insulating layers 216a, 216b and the oxide layer 212 to expose a portion of the source/drain region 206b. The etching process is preferably a dry etching process, for example, a reactive ion etch process. Moreover, as the result of etching, two dielectric layers 218a, 218b are formed.

Figure 4:
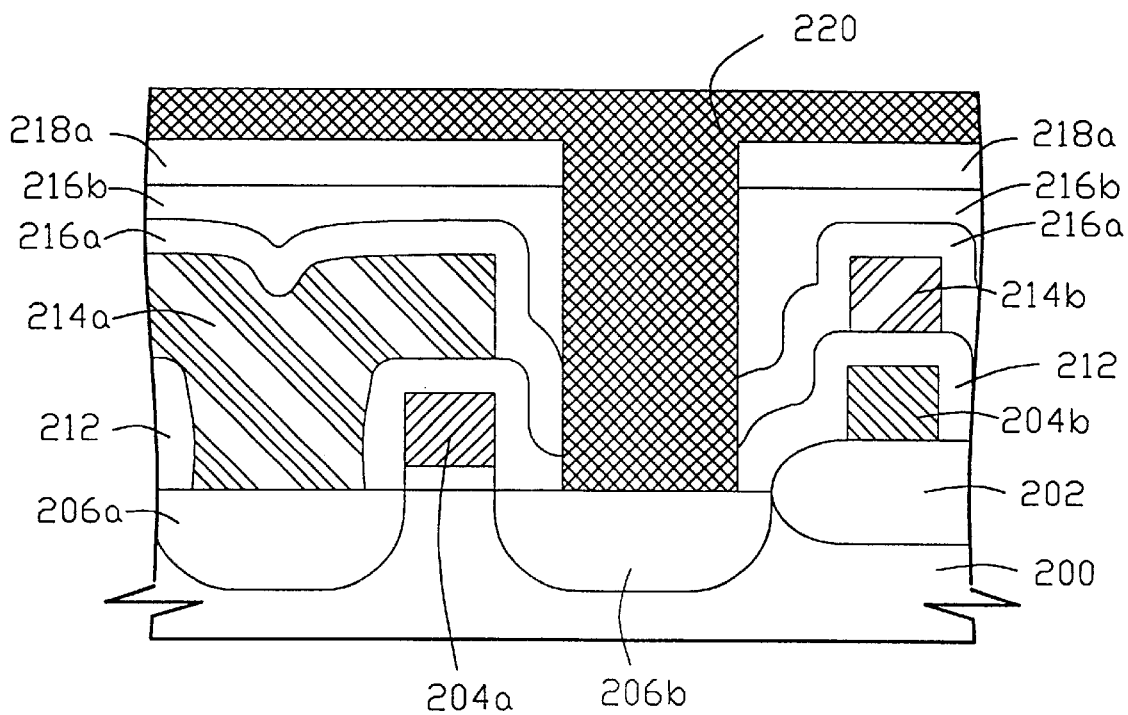
FIG. 4 shows a result of depositing a conductive layer on the dielectric layer and the contact hole.

Referring to FIG. 4, a conductive layer 220 is deposited on the dielectric layers 218a, 218b and the contact hole 219 by a conventional low pressure chemical vapor deposition process. The conductive layer 220 is preferably a polysilicon layer.

Figure 5:
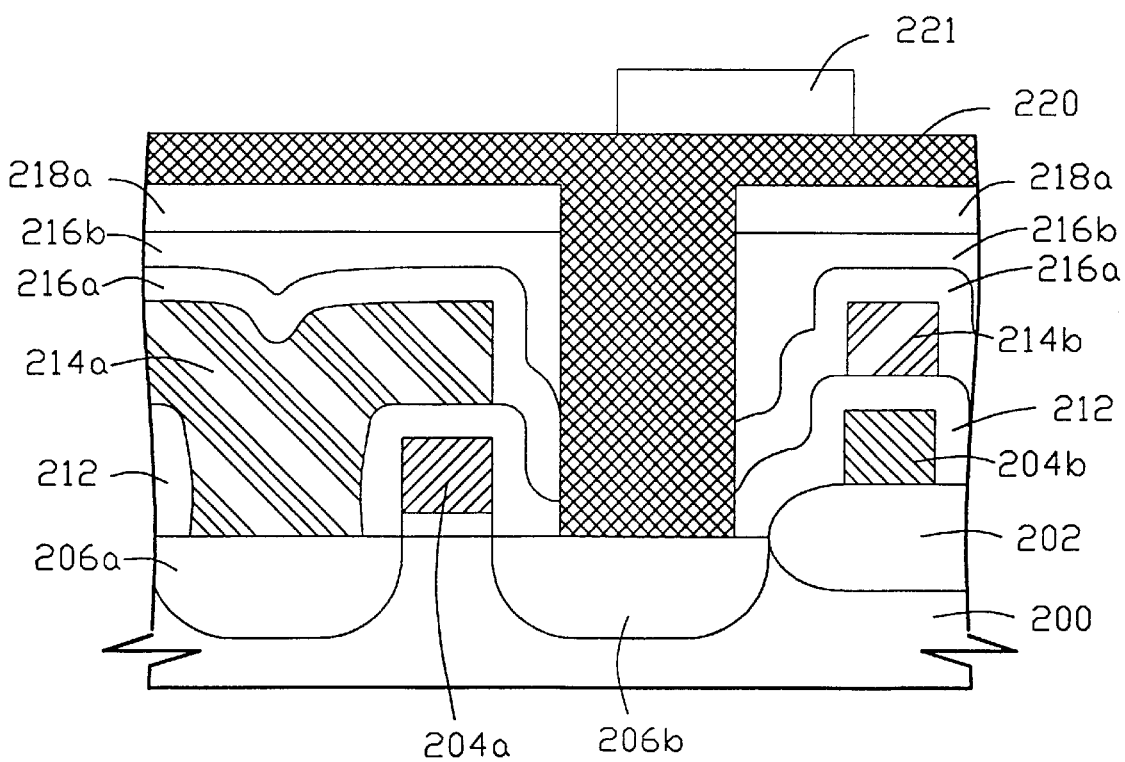
FIG. 5 shows a result of patterning the conductive layer to define a contact extension of the contact wherein a photo resist layer is formed with a result of misalignment.

Referring to FIG. 5, a photo resist layer 221 is formed on the conductive layer 220 with a result of misalignment. The photo resist layer 221 can be formed by a conventional lithography process and materials. The misalignment is the result of errors of the lithography process.

Figure 6:
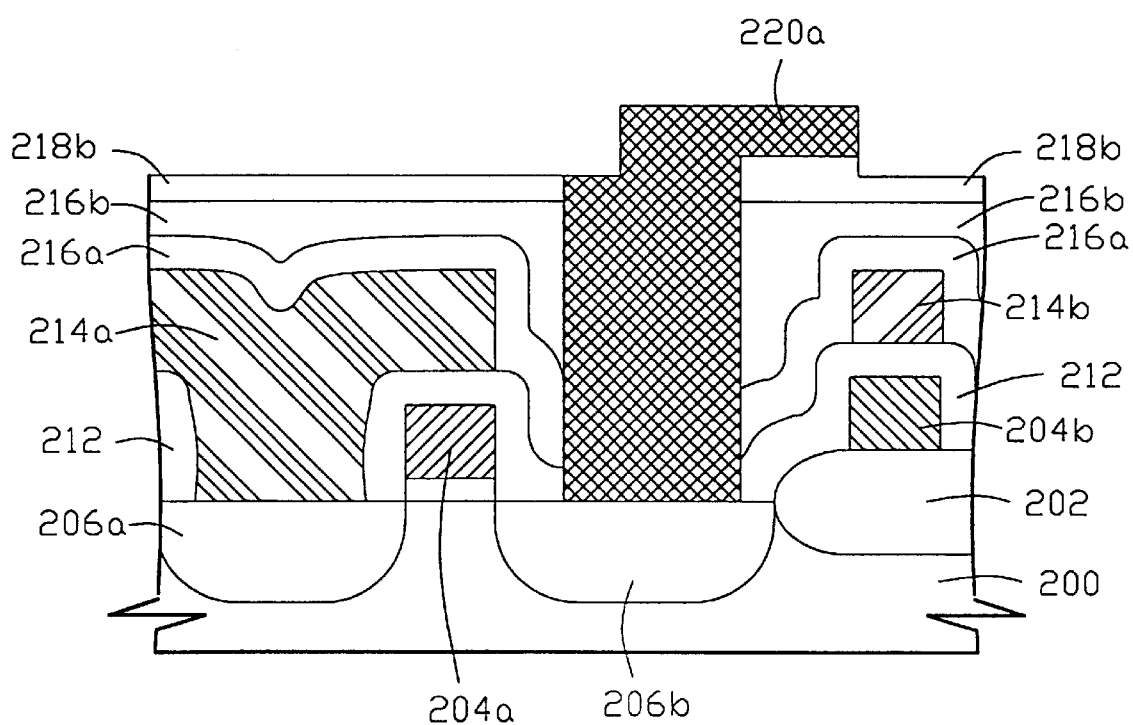
FIG. 6 shows a result of etching the conductive layer by using the photo resist layer as a mask.

Referring to FIG. 6, an electrode of a capacitor 220a is formed by using the photo resist layer 221 as a mask to etch the conductive layer 220, the dielectric layers 218a and 218b, wherein the etching process is preferably a wet etching process. Comparing with FIG. 1, no trench is formed, because the thickness of the dielectric layers 218a, 218b can protect the stud portion of the electrode 220a that is beneath the dielectric layers 218a, 218b from being etched.

The etching selectivity ratio of dielectric layers 218a and 218b, serving as buffer layers in etching process, is near the etching selectivity ratio of the conductive layer 220. When misalignment occurs, the thickness of the dielectric layers 218a, 218b can protect the stud portion of the electrode 220a that is beneath the dielectric layers 218a, 218b from being etched. Therefore, the failure of the electrode of the capacitor can be avoided. Furthermore, the alignment limitation of the contact extension can be reduced and the difficulty of the etching process can be reduced as the device size decreases in spite of the shrinking of the design rule.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for increasing tolerance of contact extension alignment in a capacitor over a bit line of a dynamic random access memory, said method comprising:

providing a substrate having a source region, a drain region which are formed therein, a gate electrode which is formed thereon and between said source region, said drain region, and a bit line which is formed thereon;

depositing an insulating layer on said gate electrode, said source region, said drain region and said bit line;

depositing a dielectric layer on said insulating layer;

transferring a hole pattern into said dielectric layer and said insulating layer to form a contact hole in said dielectric layer and said insulating layer to expose a portion of said source/drain region;

depositing a conductive layer on said dielectric layer and said contact hole, wherein an etching selectivity of said conductive layer is near an etching selectivity of said dielectric layer;

transferring an electrode pattern into said conductive layer to form an electrode of said capacitor.

2. The method according to claim 1, wherein said dielectric layer is a silicon nitride layer.

3. The method according to claim 1, wherein said dielectric layer is a silicon-oxy-nitride layer.

4. The method according to claim 1, wherein said dielectric layer is deposited by using a plasma enhanced chemical vapor deposition process.

5. The method according to claim 1, wherein said dielectric layer is deposited by using a low pressure chemical vapor deposition process.

6. The method according to claim 1, wherein said contact hole is formed by a dry etching process.

7. The method according to claim 1, wherein said conductive layer is a polysilicon layer.

8. The method according to claim 1, wherein said conductive layer is deposited by using a low pressure chemical vapor deposition process.

9. The method according to claim 1, wherein said electrode of said capacitor is formed by a wet etching process.

10. A method for increasing tolerance of contact extension alignment in a capacitor over a bit line of a dynamic random access memory, said method comprising:

provuding a substrate having a source region, a drain region which are formed therein, a gate electrode which is formed thereon and between said source region, said drain region, and a bit line which is formed thereon;

depositing an insulating layer on said gate electrode, said source region, said drain region and said bit line;

depositing a silicon nitride layer on said insulating layer;

transferring a hole pattern into said silicon nitride layer and said insulating layer to form a contact hole in said silicon nitride layer and said insulating layer to expose a portion of said source/drain region;

depositing a conductive layer on said silicon nitride layer and said contact hole, wherein an etching selectivity of said conductive layer is near an etching selectivity of said silicon nitride layer;

transferring an electrode pattern into said conductive layer to form an electrode of said capacitor.

11. The method according to claim 10, wherein said silicon nitride layer is deposited by using a plasma enhanced chemical vapor deposition process.

12. The method according to claim 10, wherein said silicon nitride layer is deposited by using a low pressure chemical vapor deposition process.

13. The method according to claim 10, wherein said contact hole is formed by a dry etching process.

14. The method according to claim 10, wherein said conductive layer is a polysilicon layer.

15. The method according to claim 10, wherein said conductive layer is deposited by using a low pressure chemical vapor deposition process.

16. The method according to claim 10, wherein said electrode of said capacitor is formed by a wet etching process.

17. A method for increasing tolerance of contact extension alignment in a capacitor over a bit line of a dynamic random access memory, said method comprising:

providing a substrate having a source region, a drain region, which are formed therein, a gate electrode which is formed thereon and between said source region, said drain region, and a bit line which is formed thereon;

depositing an insulating layer on said gate electrode, said source region, said drain region and said bit line;

depositing a silicon nitride layer by a plasma enhanced chemical vapor deposition process on said insulating layer;

transferring a hole pattern into said silicon nitride layer and said insulating layer to form a contact hole in said silicon nitride layer and said insulating layer to expose a portion of said source/drain region;

depositing a conductive layer on said silicon nitride layer and said contact hole, wherein an etching selectivity of said conductive layer is near an etching selectivity of said silicon nitride layer;

transferring an electrode pattern into said conductive layer to form an electrode of said capacitor.

18. The method according to claim 17, wherein said contact hole is formed by a dry etching process.

19. The method according to claim 17, wherein said conductive layer is a polysilicon layer.

20. The method according to claim 17, wherein said conductive layer is deposited by using a low pressure chemical vapor deposition process.

21. The method according to claim 17, wherein said electrode of said capacitor is formed by a wet etching process.

* * * * *